US012740210B2

(12) United States Patent
Lee et al.

(10) Patent No.: US 12,740,210 B2
(45) Date of Patent: Sep. 15, 2026

(54) DISPLAY DEVICE

(71) Applicant: LG DISPLAY CO., LTD., Seoul (KR)

(72) Inventors: Kwangju Lee, Paju-si (KR); Wangeon Sim, Paju-si (KR); Kyounghoon Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 720 days.

(21) Appl. No.: 17/990,773

(22) Filed: Nov. 21, 2022

(65) Prior Publication Data

US 2023/0170453 A1 Jun. 1, 2023

(30) Foreign Application Priority Data

Nov. 29, 2021 (KR) ........................ 10-2021-0167026

(51) Int. Cl.

*H10H 20/857* (2025.01)
*H10H 20/84* (2025.01)
*H10H 20/858* (2025.01)

(52) U.S. Cl.

CPC .......... *H10H 20/857* (2025.01); *H10H 20/84* (2025.01); *H10H 20/8582* (2025.01)

(58) Field of Classification Search

None

See application file for complete search history.

(56) References Cited

U.S. PATENT DOCUMENTS

2008/0078991 A1* 4/2008 Kim ....................... H10K 71/40 257/40
2017/0068128 A1* 3/2017 Lim .................. G02F 1/133512
2017/0154947 A1* 6/2017 Nakamura ......... H10K 59/8722
2017/0184915 A1 6/2017 Yang et al.
2019/0064615 A1* 2/2019 Lim .................. G02F 1/133528
2019/0285953 A1* 9/2019 Kao ..................... H10D 89/611
2020/0227491 A1* 7/2020 Wang ................... H10K 59/131
2021/0210690 A1* 7/2021 Park ................... H10K 85/1135
2022/0310979 A1* 9/2022 Li ........................ H10K 59/126

FOREIGN PATENT DOCUMENTS

| | | | |
|---|---|---|---|
| CN | 112909069 | A | 6/2021 |
| KR | 10-2018-0079044 | A | 7/2018 |
| KR | 10-2019-0014992 | A | 2/2019 |
| KR | 10-2019-0023864 | A | 3/2019 |
| KR | 20210081953 | A | 7/2021 |
| KR | 20210086029 | A | 7/2021 |

OTHER PUBLICATIONS

Office Action in Korean Appln. No. 20210167026, mailed on Nov. 30, 2024, 9 pages (with English translation).

* cited by examiner

*Primary Examiner* — Steven B Gauthier
*Assistant Examiner* — E. Rhett Cheek
(74) *Attorney, Agent, or Firm* — Fish & Richardson P.C.

(57) ABSTRACT

A display device includes a display panel configured to dispose a plurality of pixels; a cover glass configured to be disposed on a surface of the display panel; a heat dissipation sheet configured to be disposed on another surface of the display panel and has electrical conductivity; a light shielding layer configured to be disposed at edges of a surface of the cover glass and have electric conductivity; and a discharge member configured to discharge static electricity generated in the cover glass to the heat dissipation sheet by electrically connecting the heat dissipation sheet with the light shielding layer.

9 Claims, 9 Drawing Sheets

DISPLAY DEVICE

CROSS-REFERENCE TO RELATED APPLICATION

The present application claims the priority of Korea Patent Application No. 10-2021-0167026, filed on Nov. 29, 2021, which is hereby incorporated by reference in its entirety.

BACKGROUND

Field of the Disclosure

The present disclosure relates to a display device having a structure of electrostatic discharge.

Description of the Background

Recently, a field of display devices that visually express electrical information signals has rapidly advanced as we reach to the information age. Various display devices having excellent performance in terms of thinness, lightness, and low power consumption, are being developed correspondingly.

The specific aspects of the display devices are Liquid Crystal Display Apparatus (LCD), Organic Light Emitting Display Apparatus (OLED), Quantum Dot Display Apparatus and the like.

Among such display devices, a self-light emitting display device such as an organic light emitting display is considered as a competitive application since the display does not require a separate light source and is compact sized, and realizes vivid colors. The display device is equipped with a self-light emitting element disposed in each sub-pixel. The light emitting element is equipped with two electrodes and a light-emitting layer positioned between two electrodes facing each other. And the light-emitting layer emits light when transported electrons and electron holes recombine. The organic light-emitting device is a self-light emitting device that makes use of the thin light-emitting layer positioned between the electrodes, thus thinning is made available. Also, since the organic light-emitting device does not require a separate light source, it may be designed in various forms thanks to availability to implement it as a flexible, bendable and foldable display.

On a surface of a display device, an electric charge may occur because of physical friction and the like. When such electric charge is not be discharged to the outside through a ground path, the electric charge may be piled up intensively on a side surface of an end of the display panel, in other words, a bezel area of the display panel. When the electric charge is piled up in a specific area, an electric field may be formed in proportion to an amount of piled electric charge.

Thus, if the electric charge generated on a surface of a display device is not discharged to the outside effectively, a strong electric field may be formed on the side surface of the end of the display panel. If a strong electric field is formed on a side surface of an end of the display panel, a brightening phenomenon where the area on the side surface of the end gets brighter than an active area of the display panel, and a Greenish phenomenon where a certain area of the display panel gets greener may occur.

When the brightening phenomenon and the Greenish phenomenon occur on the side surface of the end of a display panel, it may lead to inferior quality of the display panel.

The above information disclosed in this Background section is only for enhancement of understanding of the background of the described technology and therefore it may contain information that does not form prior art that is already known to a person of ordinary skill in the art.

SUMMARY

Accordingly, the present disclosure is directed to a display device that substantially obviates one or more of problems due to limitations and disadvantages described above.

More specifically, the present disclosure is to provide a display device that can reduce the Greenish phenomenon and the brightening at the end of a display panel.

In an aspect of the present disclosure, a display device includes a display panel configured to dispose a plurality of pixels; a cover glass configured to be disposed on a surface of the display panel; a heat dissipation sheet configured to be disposed on another surface of the display panel and have electrical conductivity; a light shielding layer configured to be disposed at edges of a surface of the cover glass and have electric conductivity; and a discharge member configured to discharge static electricity generated in the cover glass to the heat dissipation sheet by electrically connecting the heat dissipation sheet with the light shielding layer.

The light shielding layer is formed of a plurality of layers including an electrically conductive layer, and the electrically conductive layer is formed in a lattice pattern where an area of the layer includes a plurality of opening areas.

The lattice pattern is disposed in an area where the discharge member and the light shielding layer overlap.

The discharge member is a coated layer of a conductive high molecular compound.

The discharge member is formed along a side of the display panel and contacts with the heat dissipation sheet.

The display device according to an aspect further includes a back plate disposed under the display panel, and a cushion tape disposed on a rear surface of the back plate, and the heat dissipation sheet includes an extension that extends in an outward direction from the cushion tape, and the extension is electrically connected with the light shielding layer.

The display device further includes a conductive adhesive layer disposed between the extension and the light shielding layer and electrically connecting the extension and the light shielding layer.

The display panel includes an active area and a bending area that extends and is bent from a side of the active area and the bending area does not overlap with a discharge area where the light shielding layer and the discharge member are electrically connected with each other.

Since a display device according to an aspect may reduce concentration of charge density at sides of the display panel, the display device may reduce the Greenish phenomenon and the brightening occurring intensively at a certain area in sides of the display panel.

A discharge member contacts with the light shielding layer having electrical conductivity and the heat dissipation sheet, thereby forming a travel path for electric charges.

Since the travel path for electric charges is formed thanks to disposition of the conductive adhesive layer between the heat dissipation layer and a cover member, the conductive adhesive layer cannot be exposed to the outside. Therefore, loss of chargeability arising out of damage in the travel path for electric charges by external causes such as physical contacts or shocks may be reduced.

Since the light shielding layer according to an aspect is formed in the lattice pattern which includes a plurality of opening areas, a resistance value of the light shielding layer may be easily controlled by adjusting an aperture ratio.

Advantageous effects of the present disclosure are not limited to what are mentioned hereinabove, and other effects not mentioned can be clearly understood by those skilled in the art from the following description.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
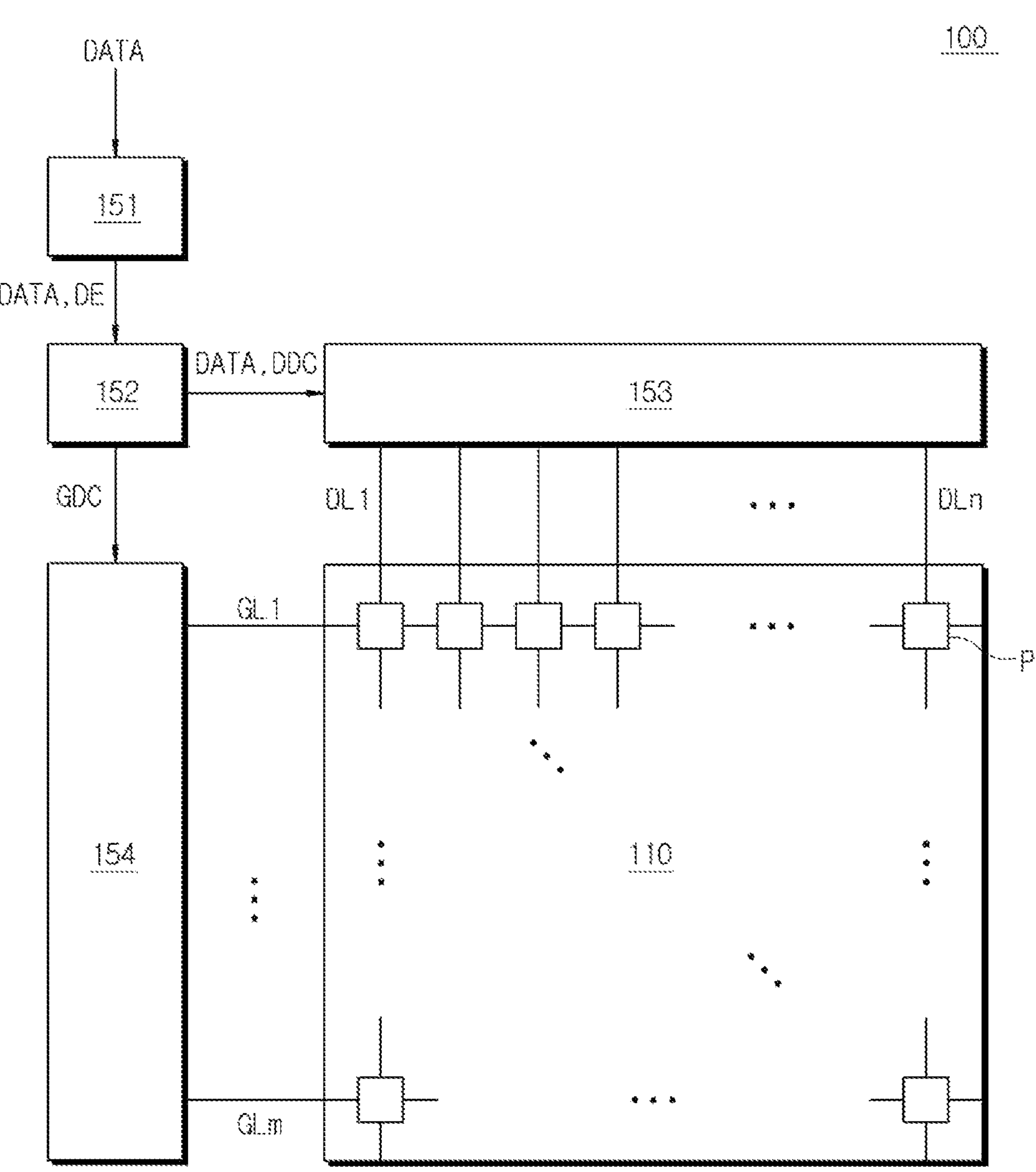
FIG. 1 is a block diagram of a display device according to an aspect of the present disclosure.

It is to be understood that the present disclosure is not limited to accompanying drawings since shapes, sizes, ratio, angle, counts and the like are taken merely as examples to explain aspects. Like reference numerals denote like elements throughout the specification. In addition, in describing the present disclosure, if a description of a related known art in detail is deemed to unnecessarily obscure the substance of the present disclosure, description of such art will be omitted. When terms, 'comprise', 'have' and 'be achieved' and the like, are used in the present disclosure, other features not mentioned therein may be added unless the terms are used with the term 'only'. The singular forms expressed herein are intended to include the plural forms as well, unless the context expressly indicates otherwise.

Components are interpreted to include an error range unless otherwise expressly stated.

In case of describing positions, for example, when describing position relation between two parts with terms such as 'upon', 'at an upward portion', 'under', 'next' and the like, one or more intervening parts may be disposed between the two parts, unless the terms are used with terms 'immediately' or 'directly'.

Though terms such as 'a first', or 'a second' are used to describe various components, these components are not confined by these terms. These terms are merely used to distinguish one component from the other component. Therefore, a first component being mentioned in the description below may be a second component in a technical concept of the present disclosure.

Like reference numerals denote like elements throughout the specification.

Various aspects of the present disclosure are provided as below by referring to the accompanying drawings. Titles of components being used in the description below are chosen for convenience of describing the specification; thus, they may be different from what they are actually named.

FIG. 1 is a block diagram of a display device according to an aspect of the present disclosure.

Referring to FIG. 1, a display device 100 according to an aspect of the present disclosure may include an image processor 151, a timing controller 152, a data driver 153, a gate driver 154 and a display panel 110.

The image processor 151 may output a data signal (DATA) supplied from the outside, a data enable signal (DE) and the like. In addition to the data enable signal (DE), the image processor 151 may generate one or more signals among a vertical synchronizing signal, a horizontal synchronizing signal, and a clock signal.

The timing controller 152 is supplied with the data signal (DATA), and a driving signal that includes the data enable signal (DE) or a vertical synchronizing signal, a horizontal synchronizing signal, a clock signal and the like from the image processor 151. The timing controller 152 may output a gate timing control signal (GDC) for controlling an operation timing of a gate driver 154, and a data timing control signal (DDC) for controlling an operation timing of a data driver 153.

In response to the data timing control signal (DDC) supplied from the timing controller 152, the data driver 153 may convert the data signal (DATA) supplied by the timing controller 152 into gamma reference voltages through sampling and latching and output it thereafter. The data driver 153 may output the data signal (DATA) through data lines (DL1~DLn).

The gate driver 154 may output a gate signal while shifting a level of a gate voltage in response to the gate timing control signal (GDC) supplied by the timing controller 152. The gate driver 154 may output the gate signal through gate lines (GL1~GLm).

The display panel 110 may display images as sub-pixels emit light by corresponding to the data signal (DATA) and the gate signal supplied by the data driver 153 and the gate driver 154.

Figure 2:
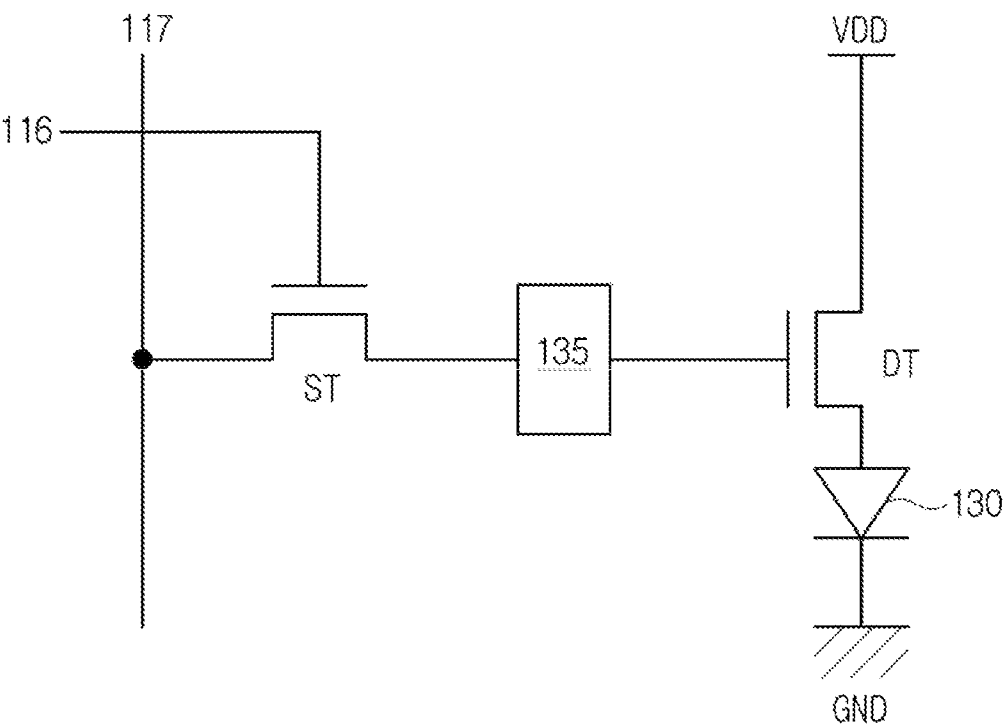
FIG. 2 is a circuit diagram of sub-pixels included in a display device according to an aspect of the present disclosure.

FIG. 2 is a circuit diagram of a sub-pixel included in a display device according to an aspect of the present disclosure.

Referring to FIG. 2, a sub-pixel of a display panel 110 according to an aspect of the present disclosure may include a switching transistor (ST), a driving transistor (DT), a compensation circuit 135 and a light emitting element 130.

The light emitting element 130 may operate to emit light by a driving current formed by a driving transistor (DT).

The switching transistor (ST) may operate switching so that the data signal supplied through a data line 117 corresponding to the gate signal provided through a gate line 116 can be saved as a data voltage in a capacitor.

The driving transistor (DT) may operate to flow a regular driving current between a high potential power line (VDD) and a low potential power line (GND), by corresponding to a data voltage stored in a capacitor.

The compensation circuit 135 compensates a threshold voltage of the driving transistor (DT), and the compensation circuit 135 may include one or more thin film transistors and capacitors. Configuration of the compensation circuit 135 may vary greatly depending on manners of compensation.

For example, a sub-pixel in FIG. 2 is configured as 2T1C (two Transistors and one Capacitor) structure which includes a switching transistor (ST), a driving transistor (DT), a capacitor and a light emitting element 130. However, if a compensation circuit 135 is added thereto, configuration of the sub-pixel may be configured variously such as 3T1C, 4T2C, 5T2C, 6T1C, 6T2C, 7T1C, 7T2C and the like.

Figure 3:
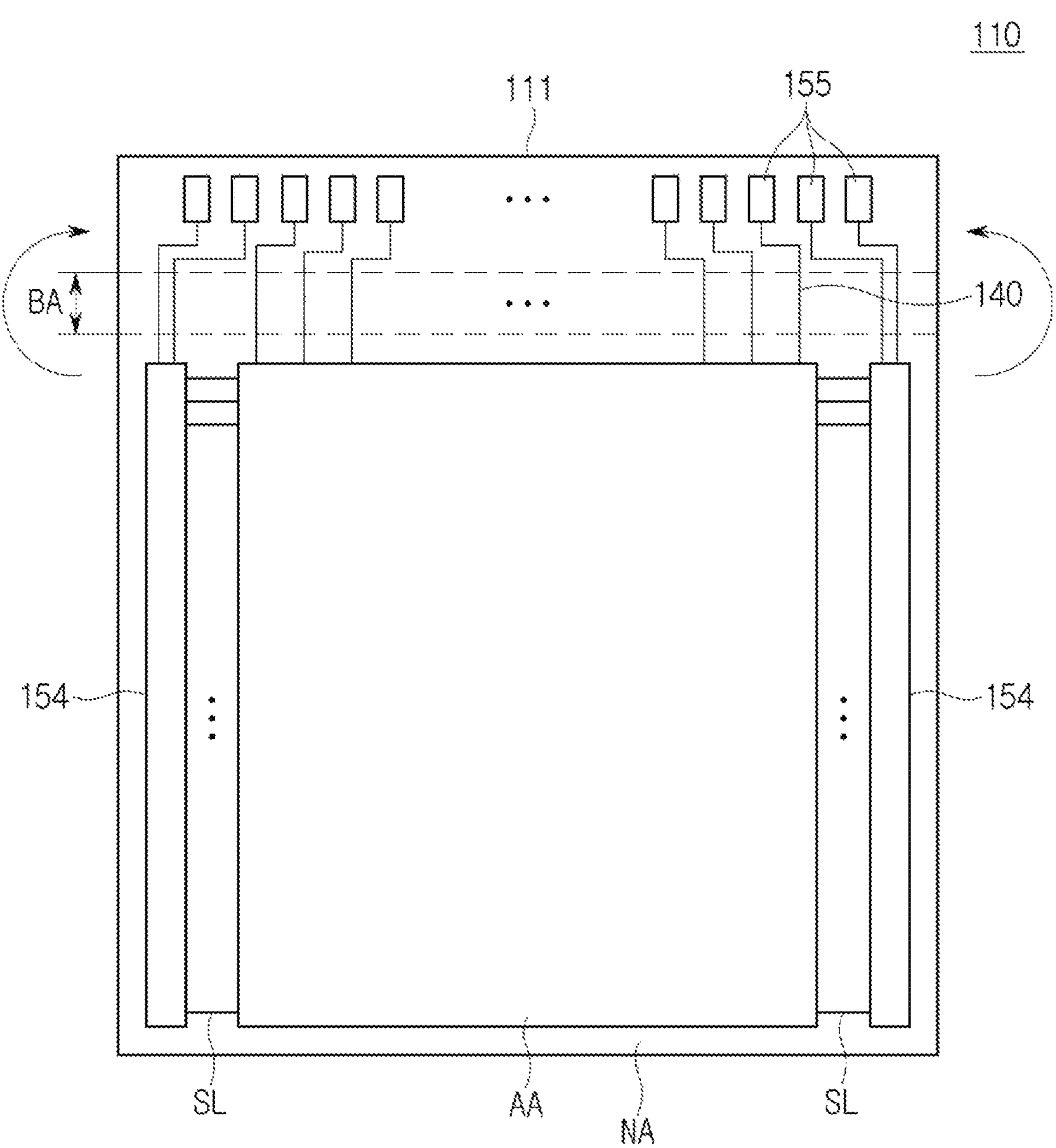
FIG. 3 is a plan view of a display device according to an aspect of the present disclosure.

FIG. 3 is a plan view of a display device according to an aspect of the present disclosure.

The display panel 110 may include an active area (AA) where pixels emitting light through a thin film transistor and a light emitting element are disposed upon a substrate 111, and an inactive area (NA) that is the bezel area surrounding edges of the active area (AA).

The substrate 111 is formed of a flexible plastic material; thus, it can have a flexible characteristic. The substrate 111 may include polyimide, and may be formed of a thin flexible glass material.

In the inactive area (NA) of the substrate 111, a circuit such as a gate driver 154 to drive the display panel 110 and wiring of various signals such as a scan line (SL) may be disposed.

A circuit to drive the display panel 110 may be disposed upon the substrate 111 in Gate in Panel (GIP) manner, or be connected to the substrate 111 in Tape Carrier Package (TCP) or Chip on Film (COF) manner.

A pad 155 of metal pattern may be disposed in one side of the substrate 111 of the inactive area (NA), and an external module may be bonded to the pad 155.

A bending area (BA) may be formed by bending a portion of an inactive area (NA) of the substrate 111 in a bending direction such as an arrow in the drawing.

A wiring and a driving circuit in order to drive a screen are disposed in the inactive area (NA) of the substrate 111. Since an image is not displayed in the inactive area (NA), the inactive area (NA) does not need to be acknowledged from a front surface of the substrate 111. Therefore, an area to position the wiring and the driving circuit can be secured while at the same time reducing the bezel area (BA), by bending some area of the inactive area (NA) of the substrate 111.

Various wirings may be formed upon the substrate 111. The wiring may be formed in the active area (AA) of the substrate 111. Or, the wiring of circuits 140 to be formed in the inactive area (NA) may transmit a signal by connecting a driving circuit, or a gate driver, a data driver and the like to each other.

The wiring of circuits 140 is formed of a conductive material, and may be formed of a conductive material with excellent flexibility in order to reduce crack caused when the substrate 111 is bent. The wiring of circuits 140 may be formed of a conductive material with excellent flexibility such as gold (Au), silver (Ag), aluminum (Al) and the like, and may be formed of various conductive materials being used in manufacturing the active area (AA). The wiring of circuits 140 may be formed of molybdenum (Mo), chrome (Cr), titanium (Ti), nickel (Ni), neodymium (Nd), copper (Cu), and a silver (Ag) and magnesium (Mg) alloy.

The wiring of circuits 140 may be configured in a multi-layer structure that includes various conductive materials and may be formed in a three-layer structure of titanium (Ti), aluminum (Al) and titanium (Ti), but not limited thereto.

Figure 4:
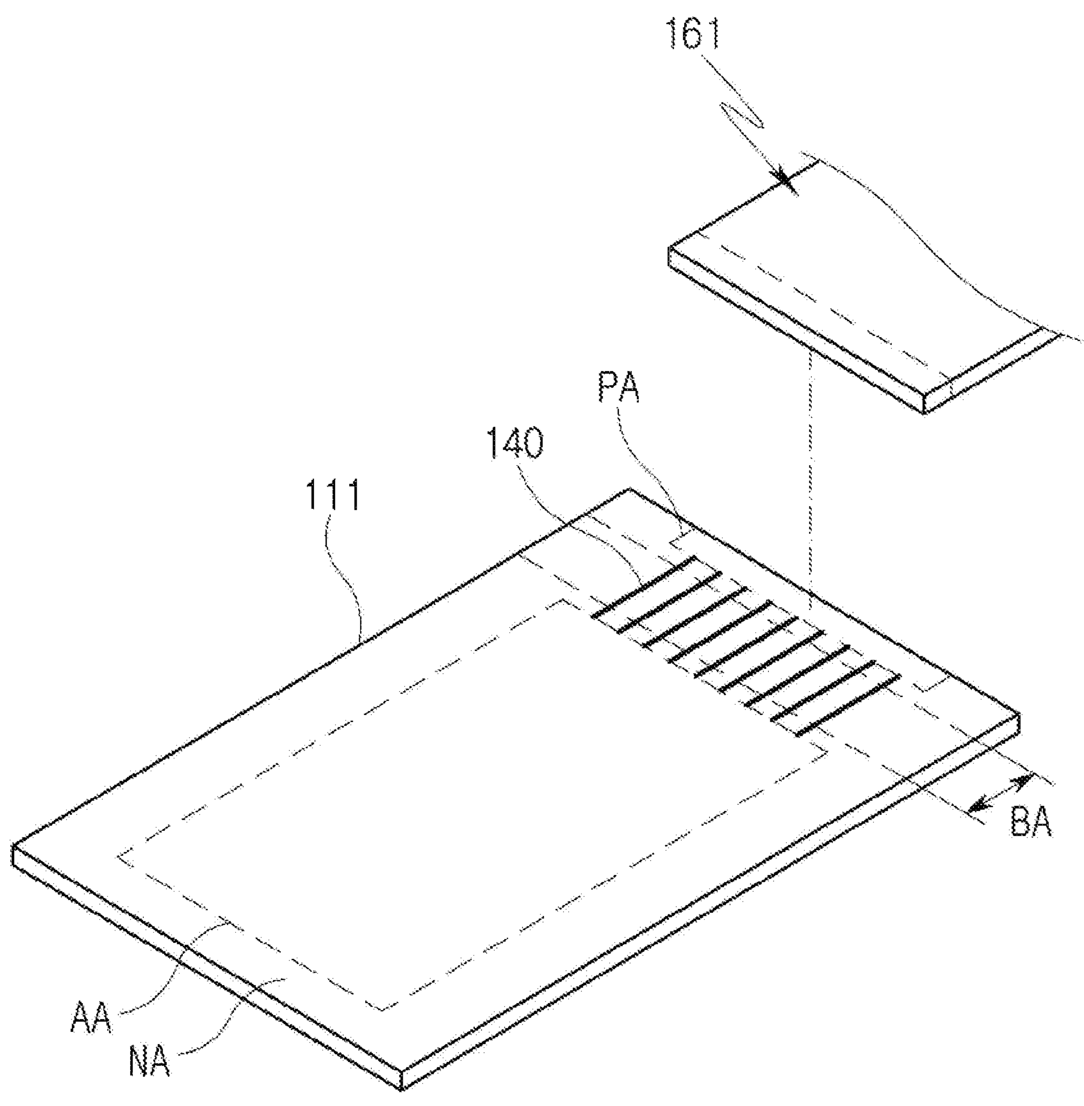
FIG. 4 is a perspective view of a display device according to an aspect of the present disclosure.
Figure 5:
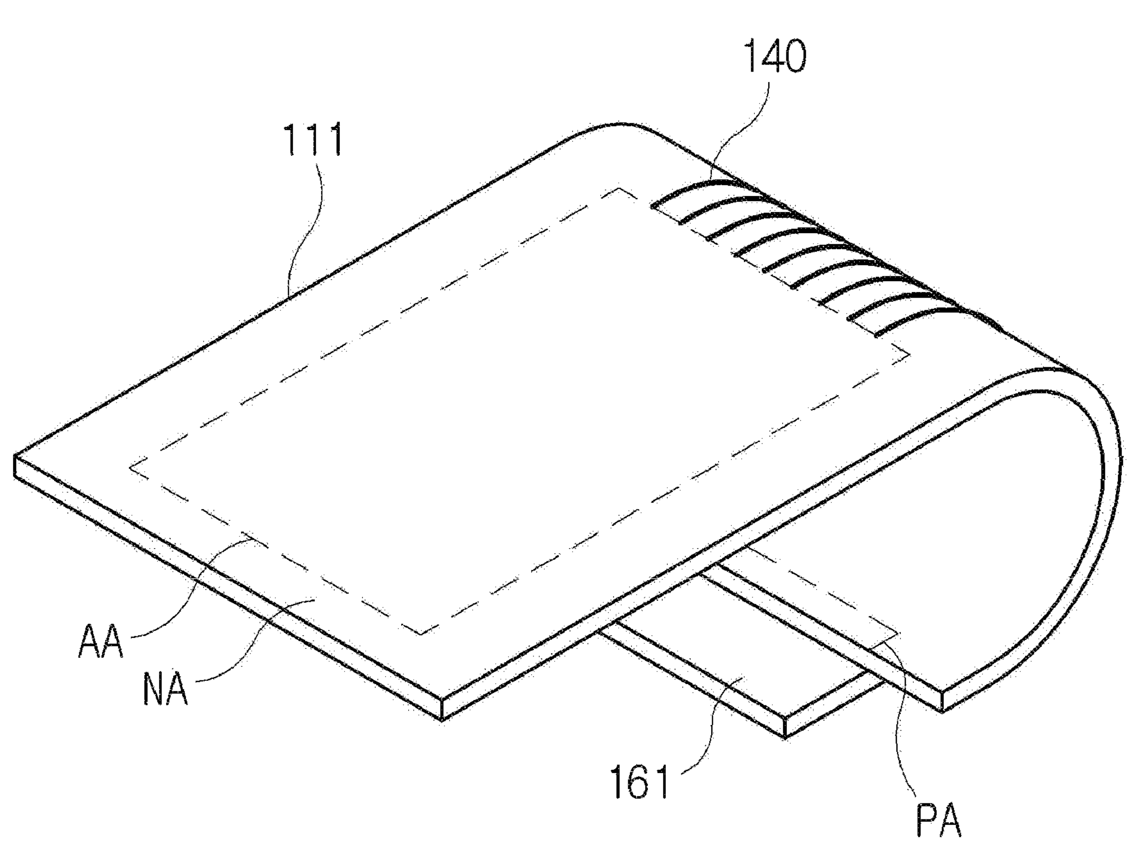
FIG. 5 is a perspective view that shows a bending status of a display device according to an aspect of the present disclosure.

FIG. 4 is a perspective view of a display device according to an aspect of the present disclosure. FIG. 5 is a perspective view that shows a bending status of a display device according to an aspect of the present disclosure.

Referring to FIG. 4, a display device 100 according to an aspect of the present disclosure may include a substrate 111 and a circuit element 161.

The substrate 111 may be divided into an active area (AA) and an inactive area (NA) which surrounds edges of the active area (AA).

The inactive area (NA) may include a pad area (PA) defined in the outside of the active area (AA). A plurality of sub-pixels may be disposed in the active area (AA). The sub-pixels are arranged in Red (R), Green (Gr), and Blue (B) manner, or R, G, B and W (White) manner within the active area, thus, may implement full colors. Sub-pixels may be divided by gate lines and data lines that cross each other.

The circuit element 161 may include bumps (or, terminal). The bumps of the circuit element 161 may be bonded to pads of the pad area (PA) through an anisotropic conductive film. The circuit element 161 may be a Chip on Film (COF) where a driver IC is mounted upon a flexible film.

In addition, the circuit element 161 may be implemented as a COG type in which the circuit element is bonded directly to a pad upon a substrate, through Chip on Glass (COG) process. And the circuit element 161 may be a flexible circuit such as FFC Flexible Flat Cable (FFC) or Flexible Printed Circuit (FPC). In aspects hereinafter, COF is taken as an example of a circuit element 161, however, the present disclosure is not limited thereto.

The driving signals supplied from the circuit element 161, for example, the gate signal, the data signal and the like may be supplied to gate lines and data lines of the active area (AA) through the wiring of circuits 140 such as a routing line.

Sufficient space should be secured to position the pad area (PA) and a circuit element 161 in the display device 100, except the active area where input images are displayed. Such space to secure falls within the bezel area, and the bezel area may be a factor that deteriorates an aesthetic impression since users who stand in front of the display device 100 may recognize it.

Referring to FIG. 5, in a display device 100 according to an aspect of the present disclosure, a lower edge of the substrate 111 may be bent in a rear surface direction to have a predefined curvature.

The lower edge of the substrate 111 may be an outside of the active area (AA) and correspond to an area where the pad area (PA) is positioned. As the substrate 111 is bent, the pad area (PA) may be positioned to overlap with the active area (AA) in a rear surface direction of the active area (AA). Therefore, the bezel area being recognized from a front of the display device 100 may be minimized. Accordingly, the aesthetic impression may be improved thanks to a narrowed bezel.

To this end, the substrate 111 may be formed of a flexible material that is bendable. For example, the substrate 111 may be formed of a plastic material such as polyimide (PI). And the wiring of circuits 140 may be formed of flexible materials. For example, the wiring of circuits 140 may be formed of materials including but not limited to metal nano wire, metal mesh, carbon nano tube (CNT) and the like.

The wiring of circuits 140 may extend from the active area (AA) and be disposed in the bending area (BA). In other words, the wiring of circuits 140 may extend in the bending area (BA) along an outer perimeter surface of the substrate 111.

Figure 6:
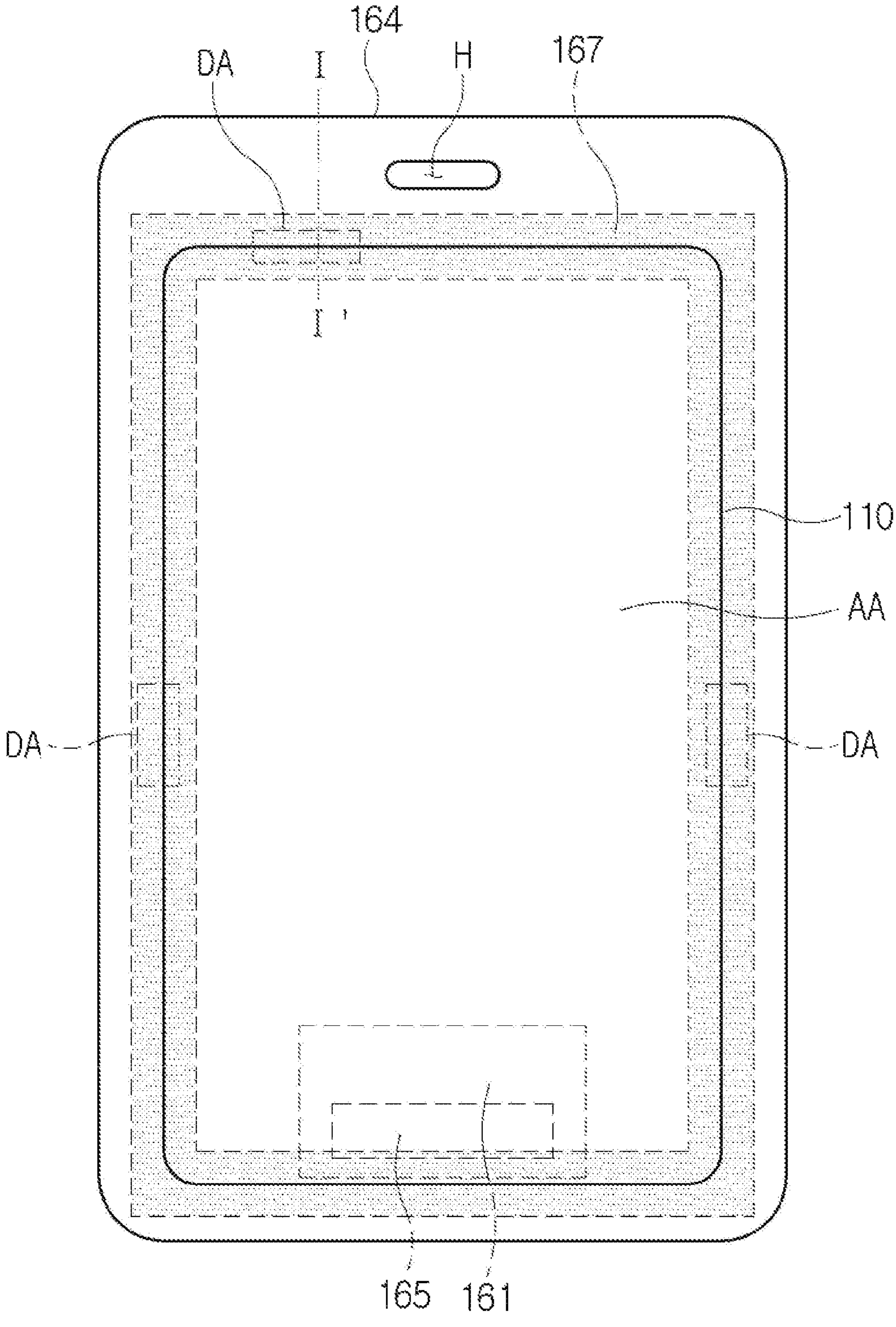
FIG. 6 is a plan view of a display device according to an aspect of the present disclosure.
Figure 7:
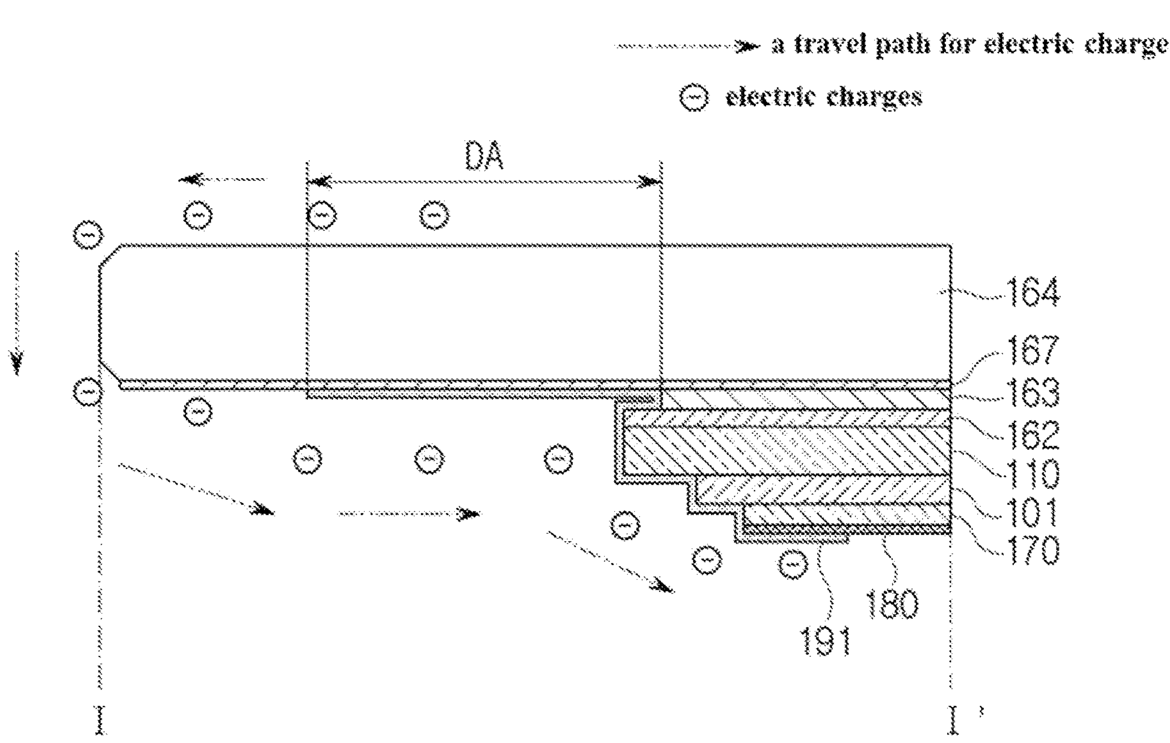
FIG. 7 is a sectional view according to an aspect taken along line I-I' of FIG. 6.

FIG. 6 is a plan view of a display device according to an aspect of the present disclosure. FIG. 7 is a sectional view according to an aspect taken along line I-I' of FIG. 6.

As illustrated in FIG. 6, a display device 100 according to an aspect of the present disclosure shows an example where a hole (H) is formed for a camera, an optical sensor, a receiver or a fingerprint sensor at an upper portion. However, the technical ideas of the present disclosure are not limited thereto.

Referring to FIG. 6 or FIG. 7, a display device 100 according to an aspect of the present disclosure may include a back plate 101, a display panel 110, a polarizer 162, an adhesive layer 163, a cover glass 164, a cushion tape 170, a heat dissipation sheet 180, and a discharge member 191.

The polarizer 162 may curb reflection of outside light in the active area (AA). If the display device 100 is intended to be used in the outside, natural light from the outside may be introduced, and be reflected by a reflective layer included in an anode of an electroluminescence element, or be reflected by an electrode made of metal positioned under the electroluminescence element. As such, images of the display device 100 may not be clearly visible because of reflected light. The polarizer 162 polarizes light introduced from the outside in a specific direction, and prevents the reflected light from being released back onto the outside of the display device 100. The polarizer 162 may be disposed upon the active area (AA) but its disposition is not limited thereto.

On top of the polarizer 162, the adhesive layer 163 may be disposed so that the cover glass 164 protecting an exterior of the display device 100 can be sticked thereon. In other words, the cover glass 164 is equipped to cover the front of the display panel 110 and serves to protect the display panel 110.

The adhesive layer 163 may include an Optically Clear Adhesive (OCA).

At four edges of the cover glass 164, a light shielding layer 167 may be formed.

The light shielding layer 167 may be formed at edges of a rear surface of the cover glass 164. The light shielding layer 167 may be coated with a black ink. The light shielding layer 167 may be formed to overlap with a portion of the adhesive layer 163, a polarizer 162 and the display panel 110 under the cover glass 167. And the light shielding layer 167 may be formed to overlap with a portion of the heat dissipation sheet 180 and the cushion tape 170 under the cover glass 167.

On a portion of a rear surface of the light shielding layer 167, the discharge member 191 may be disposed. As the light shielding layer 167 includes a conductive material, the light shielding layer 167 can have conductivity. The discharge member 191 and the light shielding layer 167 having conductivity are electrically connected with each other, thereby forming a portion of the travel path for electric charges. Static electricity generated by friction in the cover glass 164 may be delivered to the discharge member 191, through the light shielding layer 167 formed at edges of a rear surface of the cover glass 164.

As to be described hereinafter, an area where the light shielding layer 167 and the discharge member 191 overlap and are electrically connected with each other can be defined as a discharge area. The light shielding layer 167 may be formed with an inclusion of a resistance value control pattern in the discharge area. The resistance value control pattern may be formed in a lattice pattern in which one area includes a plurality of opening areas. The resistance value control pattern will be described in detail later on by referring to FIGS. 9 to 10.

In an outer side of the display device 100, a discharge member 191 may be disposed at a portion of a rear surface of the light shielding layer 167. The discharge member 191 may be formed along a side of the back plate 101, a side of the display panel 110, a side of a polarizer 162, a side of the adhesive layer 163, a side of the cushion tape 170 and a side of the heat dissipation sheet 180. In other words, the discharge member 191 may contact with the light shielding layer 167, the back plate 101, the display panel 110, the polarizer 162, the adhesive layer 163, the cushion tape 170 and the heat dissipation sheet 180 and form the travel path for electric charges. Further, as illustrated in FIG. 7, the discharge member 191 may contact with both a rear surface and a side of the heat dissipation sheet 180.

Under the display panel 110, the back plate 101 may be disposed. If the substrate 111 of the display panel 110 is made of a plastic material such as polyimide, a manufacturing process of the display device 100 proceeds with a supporting substrate made of glass disposed under the display panel 110, and the supporting substrate may be separated and released after the manufacturing process ends.

After the supporting substrate is released, a component to support the display panel 110 is still required. Thus, the back plate 101 to support the display panel 110 may be disposed under the display panel 110.

The back plate 101 may prevent the underneath portion of the substrate from attachment of a foreign substance, and may absorb shocks from the outside. The back plate 101 may be formed of a plastic thin film such as polyimide (PI), polyethylene naphthalate (PEN), polyethylene terephthalate (PET), and combination thereof.

The cushion tape 170 may be attached to a rear surface of the back plate 101 by using an adhesive. The adhesive may have an embossing pattern, and may consist of Pressure Sensitive Adhesive (PSA). The cushion tape 170 may serve to be pressed and absorb the shocks when an external force is given. Specifically, the cushion tape 170 may include multiple air bubbles, and the air bubbles may effectively absorb physical shocks given to the display device 100. The cushion tape 170 may be formed of acrylic foam, but not limited thereto.

Under the cushion tape 170, the heat dissipation sheet 180 is disposed. The heat dissipation sheet 180 serves to release heat generated in the display panel 110. In addition, the heat dissipation sheet 180 serves to earth the discharge member 191 that will be described hereinbelow. In addition, the heat dissipation sheet 180 may serve to protect from shocks given from a rear surface of the display device 100.

To this end, the heat dissipation sheet 180 may be formed of materials having superior heat conductivity, electrical conductivity, and mechanical strength. For example, the heat dissipation sheet 180 may be formed of metal, such as copper (Cu), or stainless steel (SUS).

The discharge member 191 may be formed of materials having electrical conductivity in order to release static electricity to the heat dissipation sheet 180. Therefore, the discharge member 191 may be formed of a conductive high molecular compound as well as metals having superior electrical conductivity.

Since the display panel 110, the polarizer 162, the adhesive layer 163, the cushion tape 170 and the heat dissipation sheet 180 have stepped levels, the discharge member 191 needs to be configured in a staircase shape. If the discharge member 191 consists of metals, there will be a difficulty in processing it to take the staircase shape.

Therefore, the discharge member 191 according to an aspect of the present disclosure may be formed with an anti-static solution that includes a conductive high molecular compound. For example, the discharge member 191 may be formed by coating a side of the display panel 110, a side of the polarizer 162, a side of the adhesive layer 163, a side of the cushion tape 170, and a side of the heat dissipation sheet 180 with the anti-static solution.

The discharge area (DA) where the light shielding layer 167 and the discharge member 191 are electrically connected with each other may be formed at the outside of the active area (AA). However, there is some restriction on its position. For example, the discharge area (DA) may not be disposed in an area where the wiring of circuits 140 for driving panels 110 is formed. In addition, in a hole (H) positioned at an upward portion of the display device 100, a camera, an optical sensor, a receiver and the like may be disposed and the discharge area (DA) may not be disposed between the hole (H) and the active area (AA). And in an area of the display device 100, the wiring of circuits for a fingerprint sensor, a radio telecommunication module, an antenna and the like may be additionally disposed. However, if the discharge area (DA) is located in such area, there may be a problem of mutual electrical interference.

In short, the discharge area (DA) may be formed at some area at an upward portion and some area at a left or right side as illustrated in FIG. 6. The position to form the discharge area (DA) may vary depending on designs of the display device 100.

In the discharge area (DA), the light shielding layer 167 and the discharge member 191 may be fully overlaid. Thus, since the light shielding layer 167 fully covers the discharge member 191 from the front, possibility of deteriorated image quality due to forming of the discharge member 191 may be minimized.

Hereinafter, a display device according to an aspect of the present disclosure will be explained. Differences between the display device according to an aspect of the present disclosure and the display device according to other aspects of the present disclosure are only the discharge member and the heat dissipation sheet. Therefore, the differences regarding the two parts will be described in detail hereinbelow.

Figure 8:
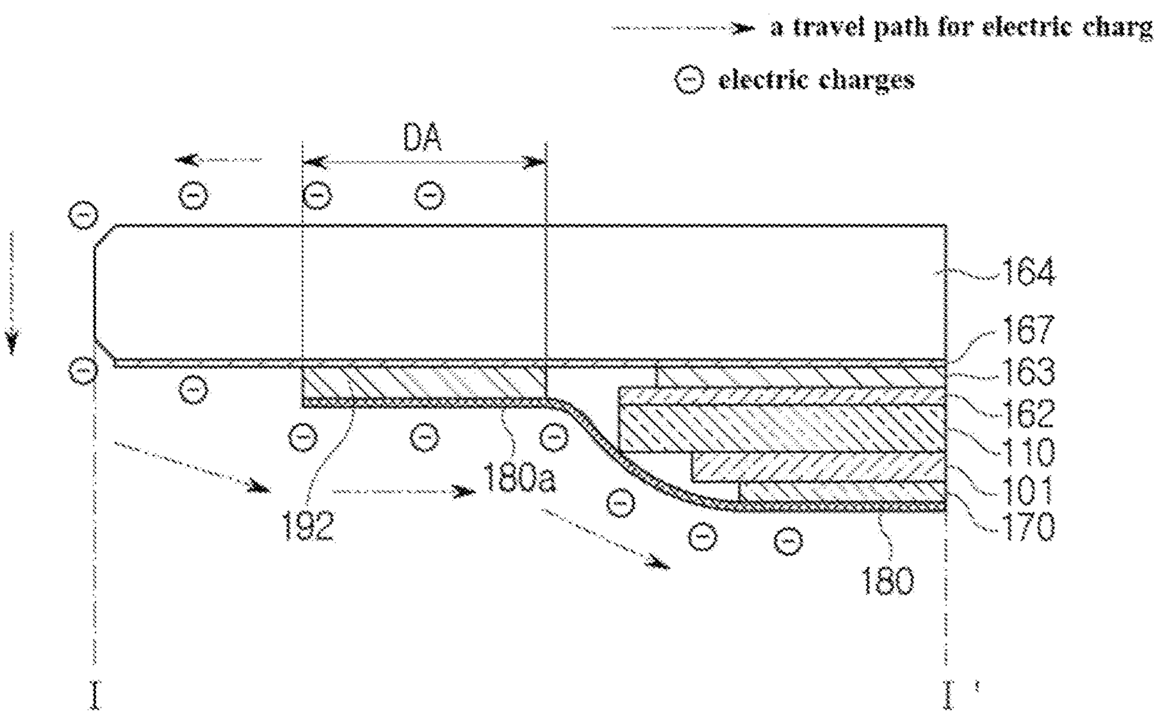
FIG. 8 is a sectional view according to another aspect taken along line I-I' of FIG. 6.

FIG. 8 is a sectional view according to another aspect taken along line I-I' of FIG. 6.

Referring to FIG. 8, the heat dissipation sheet 180 may include the extension 180*a* that extends in an outward direction from a cushion tape 170. The extension 180*a* is electrically connected with the light shielding layer 167 in the discharge area (DA). The conductive adhesive layer 192 disposed between the extension 180*a* and the light shielding layer 167 electrically connects the extension 180*a* with the light shielding layer 167.

In the aspect of FIG. 8, since the heat dissipation sheet 180 extends and forms a portion of a discharge member, efficiency of a process to form the travel path for electric charges may be enhanced, compared with the aspect of FIG. 7. In other words, in the aspect of FIG. 8, the extension 180*a* of the heat dissipation sheet 180 and the conductive adhesive layer 192 serve as discharge members. The conductive adhesive layer 192 may be a conductive tape, but not limited thereto.

Since the conductive adhesive layer is formed between the heat dissipation sheet 180 and the cover glass 164 and the travel path for electric charges is formed accordingly, the conductive adhesive layer 192 may not be exposed to the outside. Therefore, loss of chargeability arising out of damage in the travel path for electric charges by external causes such as physical contacts or shocks may be reduced.

In addition, since the travel path for electric charges is formed between the heat dissipation sheet 180 and the cover glass 164, stable resistance control is made available and the travel path for electric charges that is as narrow as possible is formed stably, compared with forming the travel path for electric charges with the anti-static solution.

Moreover, if the travel path for electric charges is formed by the anti-static solution as shown in the aspect in FIG. 7, it will be difficult to form even thickness over the whole areas coated with the anti-static solution. Thus, it is difficult to manage even resistance over the whole areas.

However, if forming the travel path for electric charges with the conductive adhesive layer 192 as provided in the aspect in FIG. 8 of the present disclosure, it is easy to manage even resistance of the conductive adhesive layer 192 in the whole areas in case even thickness of the conductive adhesive layer 192 is achieved during a manufacturing process.

Figure 9:
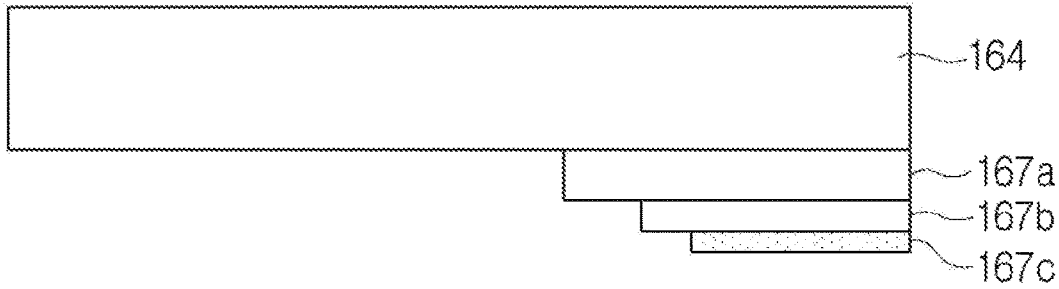
FIG. 9 is a diagram of a stacked-layer structure of the light shielding layer according to an aspect of the present disclosure.
Figure 10:
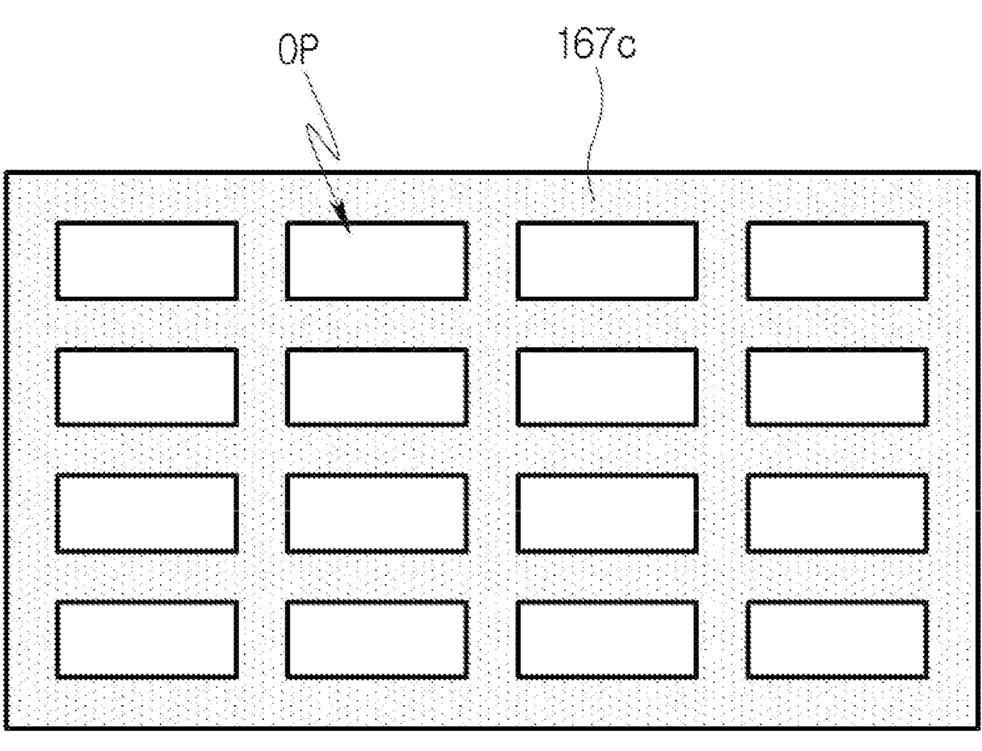
FIG. 10 is a diagram of a lattice pattern of a light shielding layer according to an aspect of the present disclosure.

FIG. 9 is a diagram of a stacked-layer structure of a light shielding layer according to an aspect of the present disclosure. FIG. 10 is a diagram of a lattice pattern of a light shielding layer according to an aspect of the present disclosure.

Description on the light shielding layer according to an aspect of the present disclosure by referring to FIG. 9 to FIG. 10 is as follows.

The light shielding layer 167 according to an aspect may be formed of a stacked-layer structure which consists of a first layer 167*a*, a second layer 167*b*, and a third layer 167*c*.

Compared with the third layer 167*c*, the first layer 167*a* and the second layer 167*b* are formed of a material with relatively higher resistance. The first layer 167*a* and the second layer 167*b* may be formed of a material with low light transmittance. The first layer 167*a* and the second layer 167*b* are mixed and may implement a black color when mixed.

The first layer 167*a* and the second layer 167*b* of the light shielding layer 167 are aimed at defining edges of the display area by shielding light. Thus, if one layer can implement a black color, it is allowable to be formed of one layer, since making a black color with two layers is not mandatory.

Compared with the first layer 167*a* and the second layer 167*b*, the third layer 167*c* may be formed of a material with higher electrical conductivity, and is formed of a material with relatively lower resistance. The third layer 167*c* may be formed of chrome (Cr), graphite, or resin which includes conductive particles. The resin may be formed of one or more materials among acrylic resin, epoxy resin, phenolic resin, polyamides resin, polyimides resin, unsaturated polyesters resin, polyphenylene resin, polyphenylenesulfides resin, and benzocyclobutene but not limited thereto. Further, the conductive particles may be formed of a material among molybdenum (Mo), chrome (Cr), titanium (Ti), nickel (Ni), neodymium (Nd), copper (Cu), silver (Ag) and magnesium (Mg) alloys but not limited thereto.

The third layer 167*c* may be formed in a lattice pattern where one area includes a plurality of opening areas (OP) as illustrated in FIG. 10. The lattice pattern may be formed in the discharge area (DA) where the discharge member and the light shielding layer 167 overlap.

As described above, the third layer 167*c* is formed of materials having conductivity, and has low resistance. Regarding the light shielding layer 167, from only a perspective of providing the travel path for electric charges to static electricity generated in the cover glass 164, the lower the resistance, the better. That is, when only the chargeability is considered, the lower the resistance, the better effect of the light shielding layer 167.

Meanwhile, a radio telecommunication module, an antenna, a camera and the like may be added to the display device 100. If such added elements are disposed adjacent to the discharge area (DA), electrical interference by electrostatic discharge may occur. In particular, if resistance of the light shielding layer 167 formed in the discharge area (DA) is too low, influence of such electrical interference may become stronger. Therefore, resistance of the light shielding layer 167 formed in the discharge area (DA) needs to be managed to be equal to, or above a certain level.

In the meantime, since positions of a radio telecommunication module, an antenna, a camera and the like being added to the display device 100 may vary depending on designs, disposition of the discharge area (DA) may vary as well. Also, depending on a design of the display device 100, managed level of resistance value of the light shielding layer 167 positioned in the discharge area (DA) may vary.

The inventors of the present disclosure derived a method of forming the lattice pattern where one area includes a plurality of opening areas (OP) as a way to manage resistance of the light shielding layer 167. Changing materials or physical properties may be considered in order to manage resistance of the light shielding layer 167, however, it is burdensome to examine stability against a new material and the like each time.

The light shielding layer 167 according to an aspect may generate various resistance value by adjusting aperture ratio in the lattice pattern. The higher the aperture ratio, the narrower the area of the third layer 167*c* which consists of a conductive material that allows electricity flowing. Therefore, the resistance gets higher. To the contrary, the lower the aperture ratio, the wider the area of the third layer 167*c* which consists of a conductive material. Therefore, the resistance gets lower.

The light shielding layer 167 according to an aspect is formed in the lattice pattern which includes a plurality of opening areas, and the resistance value of the light shielding layer 167 may be easily managed by adjusting the aperture ratio. Therefore, the method allows easily controlling and managing resistance value of the light shielding layer 167 formed in the discharge area (DA), with adapting to a design change of the display device 100.

It would be understood that the technical configurations of the present disclosure described herein may be implemented in other concrete forms by those skilled in the art without departing from the technical concept or essential features thereof. Thus, it should be understood that aspects described hereinabove are examples in all aspects, and do not limit the present disclosure. Moreover, the scope of the present disclosure will be denoted by the claims that are provided hereinbelow, rather than the detailed description. In addition, it should be construed that all modifications or variations that are derived from the meaning, scope and the concept of equivalence of the claims are covered in the scope of the present disclosure.

What is claimed is:

1. A display device comprising:

a display panel configured to dispose a plurality of pixels;

a cover glass disposed on one surface of the display panel;

a heat dissipation sheet disposed on another surface of the display panel and having electrical conductivity;

a light shielding layer disposed at edges of a surface of the cover glass and having electrical conductivity; and a discharge member configured to discharge static electricity generated in the cover glass to the heat dissipation sheet by electrically connecting the heat dissipation sheet with the light shielding layer, wherein the light shielding layer is formed of a stacked plurality of layers including (i) an electrically conductive layer with a plurality of opening areas and (ii) at least one layer arranged between the electrically conductive layer and the cover glass, and wherein in the stacked plurality of layers of the light shielding layer, the at least one layer is configured with a lower conductivity than the electrically conductive layer.

2. The display device of claim 1, wherein the electrically conductive layer is formed in a lattice pattern where an area of the electrically conductive layer includes the plurality of opening areas.

3. The display device of claim 2, wherein the lattice pattern is disposed in an area where the discharge member and the light shielding layer overlap with each other.

4. The display device of claim 1, wherein the discharge member is a coated layer of a conductive polymeric compound.

5. The display device of claim 4, wherein the discharge member is formed along a side of the display panel and in contact with the heat dissipation sheet.

6. The display device of claim 1, further comprising:

a back plate disposed under the display panel; and a cushion tape disposed on a rear surface of the back plate.

7. The display device of claim 6, wherein the heat dissipation sheet comprises an extension that extends in an outward direction from the cushion tape, and the extension is electrically connected with the light shielding layer.

8. The display device of claim 6, further comprising a conductive adhesive layer disposed between the extension and the light shielding layer and electrically connecting the extension and the light shielding layer.

9. The display device of claim 1, wherein the display panel comprises an active area and a bending area that extends and is bent from a side of the active area and the bending area does not overlap with a discharge area where the light shielding layer and the discharge member are electrically connected with each other.

* * * * *